US007166324B2

(12) United States Patent
Hotti

(10) Patent No.: US 7,166,324 B2
(45) Date of Patent: Jan. 23, 2007

(54) METHOD, EQUIPMENT, AND MATERIAL FOR CREATING A SURFACE ON A METAL

(75) Inventor: Esko Hotti, Mikkeli (FI)

(73) Assignee: Mikkelin Ammattikorkeakouluyhtyma, Mikkeli (FI)

( * ) Notice: Subject to any disclaimer, the term of this patent is extended or adjusted under 35 U.S.C. 154(b) by 0 days.

(21) Appl. No.: 10/525,585

(22) PCT Filed: Aug. 27, 2003

(86) PCT No.: PCT/FI03/00624

§ 371 (c)(1),
(2), (4) Date: Feb. 24, 2005

(87) PCT Pub. No.: WO2004/027105

PCT Pub. Date: Apr. 1, 2005

(65) Prior Publication Data

US 2006/0000523 A1 Jan. 5, 2006

(30) Foreign Application Priority Data

Sep. 19, 2002 (FI) ................................. 20025043

(51) Int. Cl.
*B05D 3/02* (2006.01)

(52) U.S. Cl. .................................... 427/228; 427/248.1

(58) Field of Classification Search ................. 427/228
See application file for complete search history.

(56) References Cited

U.S. PATENT DOCUMENTS 3,106,473 A 10/1963 Hollenbeck
3,903,267 A * 9/1975 Miler et al. .............. 424/725.1
4,401,514 A * 8/1983 Kanzler et al. ............... 203/15
4,623,400 A 11/1986 Japka et al.
4,735,685 A * 4/1988 Bernheim et al. .......... 162/135
4,810,510 A 3/1989 Lever et al.
5,186,120 A 2/1993 Ohnishi et al.
5,648,416 A * 7/1997 Miller et al. ................ 524/500

FOREIGN PATENT DOCUMENTS

DE 3423024 A1 * 1/1986
JP 74003741 B * 1/1974
SE 145039 4/1954
WO 00/47797 8/2000

* cited by examiner

*Primary Examiner*—Bret Chen
(74) *Attorney, Agent, or Firm*—Fildes & Outland, P.C.

(57) ABSTRACT

The invention relates to a method for surface treating the surface of a metal. The surface treatment is performed in a surfacing chamber, using a surfacing material, which is formed of one or more compounds and possible additives, and in which the surfacing material is brought to a principally gaseous state, the surfacing material is led to the chamber, and the surfacing material is permitted to react with the metal surface being treated. The metal surface being treated is subjected in the chamber to a passing flow of the surfacing material, and in which the said surfacing material comprises compounds arising in dry distillation of deciduous-wood. The invention also relates to the equipment and surfacing material used in the method.

7 Claims, 2 Drawing Sheets

METHOD, EQUIPMENT, AND MATERIAL FOR CREATING A SURFACE ON A METAL

TECHANICAL FIELD

The present invention relates to a method for surface treating the surface of a metal, in which the surface treatment is performed in a surfacing chamber, using a surfacing material, which is formed of one or more compounds and possible additives, and in which the surfacing material is brought to a principally gaseous state, the surfacing material is led to the chamber, and the surfacing material is permitted to react with the metal surface being treated.

In addition, the invention also relates to the equipment and surfacing material used in the method.

BACKGROUND OF THE INVENTION

Many metals need to be surfaced in order to be applied to various purposes of use. Numerous surfacing materials and methods for arranging these are known. A few examples of these that can be mentioned include surfacing metals with other metals, with rubber-based substances, and with paints using various painting methods. In addition to the above, methods and surfacing materials used in them are also known, which attempt to exploit the electrochemical properties between the surface to be treated and the surfacing material.

Though most of the metal surfacing materials and the methods based on them will indeed achieve the desired end result, the surfacing is then also expensive. Factors associated with the size of the pieces to be surfaced often also limit the use of these methods. In many cases, the temperature of the piece to be surfaced must be brought to such a high level as to even make the surfacing impossible in practice.

Many methods for surfacing a metal with a metal are only suitable for being carried out in permanent plants, thus limiting, for example, the size of the pieces being treated and increasing transport costs. In addition, in certain cases some of the metal surfacing materials may lead to problems, for example, in processes related to the recycling of the metal. In many cases, the use of the various rubber and plastic surfacings is limited while they are often also expensive.

The most widely used metal surfacings are the various paints that are spread using very many different techniques. There are also many problematic aspects relating to painting. The difficulty of getting the paint layer into cramped and complex structures must be regarded as one of the most important of these. In such cases, if the paint layer is either too thin, or is entirely lacking in even small parts of the structure, corrosion damage can start and lead to structural damage. Another very common problem is the paint being knocked or scratched off the surface of the metal, which will also cause corrosion damage to start.

For the above reasons, the paint layer must often be repaired or even entirely renewed, sometimes at very short intervals. The removal of the previous paint layer, the repair of possible corrosion damage, and the spreading of new layer of paint demands time and leads to expenses.

Further, when using all of the aforementioned methods, cleaning, in which dirt and grease are removed, must be carried out on the metal surface prior to the surfacing treatment. If there is, for example, mill scale on the surface, pickling treatment is then becomes practically indispensable.

EP patent publication 0 193 419 (Fairchild Semiconductor Corporation) discloses vapour surfacing that is carried out at low pressure. The surfacing material used in the method is brought to the process in a solid state. The pressure and flow of the gas flow to the surfacing chamber are regulated with the aid of valves, nozzles, and a special cold condensed system arranged in a loop of the feed line, as well as a vacuum booster pump. However, the disclosed method and apparatus are difficult to arrange, for example, as a mobile unit and particularly the treatment of large surfacing objects demands large chamber structures. In addition, the vaporization apparatus must be arranged in a relatively large furnace, which must be kept at a higher temperature than that of the actual vaporization apparatus.

SUMMARY OF THE INVENTION

The present invention is intended to create a method and equipment and a material in connection with it, by means of which the aforesaid drawbacks can be reduced significantly, or even entirely eliminated and which will achieve a way of create surfacing of metal surfaces that is in all respects advantageous.

The characteristic features of the method according to the invention for surface treating the surface of a metal, in which the surface treatment is performed in a surfacing chamber, using a surfacing material, which is formed of one or more compounds and possible additives, and in which the surfacing material is brought to a principally gaseous state, the surfacing material is led to the chamber, and the surfacing material is permitted to react with the metal surface being treated, is characterized in that the metal surface being treated is subjected in the chamber in which there is a through flow of the surfacing material to an exhaust connection, and in which the said surfacing material comprises compounds arising in dry distillation of deciduous-wood.

Equipment for surface treating a metal surface, which includes means for manufacturing a surfacing material, such as, for example, bringing it from a liquid state into a gaseous state, a surfacing chamber equipped with at least one input connection, in which the metal surface to be surface treated in arranged and surfacing material feed piping fitted between them, which is connected to the said input connection of the surfacing chamber, at least one exit connection arranged in the surfacing chamber, through which the said gaseous surfacing material is arranged to be led out of the chamber, possible auxiliary and storage equipment, for example for regulating the process Quantities and controlling the surfacing process and means for leading gaseous compounds ($CO(g)$, $H_2(g)$) as its own fractions for manufacturing the surfacing material, is characterized in that the said surfacing material is arranged to form from compounds arising in dry distillation of deciduous-wood from which at least part is separated one or more fractions and which fractions are again arranged to be combined by means of the equipment when manufacturing the surfacing material in connection with the equipment.

A surfacing material for surface treating a metal surface which is formed of one or more compounds and possible additives, and in which the surfacing material is brought to a principally gaseous state the surfacing material is led to a surfacing chamber, and the surfacing material is permitted to react with the metal surf ace being treated, is characterized in that the surfacing material comprises compounds arising in dry distillation of deciduous-wood.

With the aid of the method and surfacing material according to the invention, a surfacing is created, which has great permanence and is resistant to scratching and knocks and will not easily detach from the undersurface. The corresponding surfacing equipment can be easily moved and assembled. Thus, surfacing does not necessarily require permanent plants, thus allowing even large pieces to be surfaced, for example, in field conditions. Besides the size of the piece being surfaced, factors related to its shape also do not limit the successful creation of a surface.

A particular advantage of the method and surfacing material according to the invention can be regarded as being the fact that the tar that arises in dry distillation of deciduous-wood can be used as a raw material for the surfacing material. As is known, there are practically no commercial uses for deciduous-wood tar and its distillates, which are instead generally burned in a mixture with a supplementary fuel during the carbonization process of the wood material.

According to a first embodiment, the deciduous-wood tar can be brought into contact with the surfacing object as fractions in different states, from which the gas mixture arising in the real dry distillation process is assembled. According to a second embodiment, the dry distillation process can also be carried out in connection with the surfacing application.

The other features characterizing the invention will be apparent from the accompanying claims while other advantages achieved by the invention are stated in greater detail in the description portion.

These and other features and advantages of the invention will be more fully understood from the following detailed description of the invention taken together with the accompanying drawings.

BRIEF DESCRIPTION OF THE INVENTION

Figure 1:
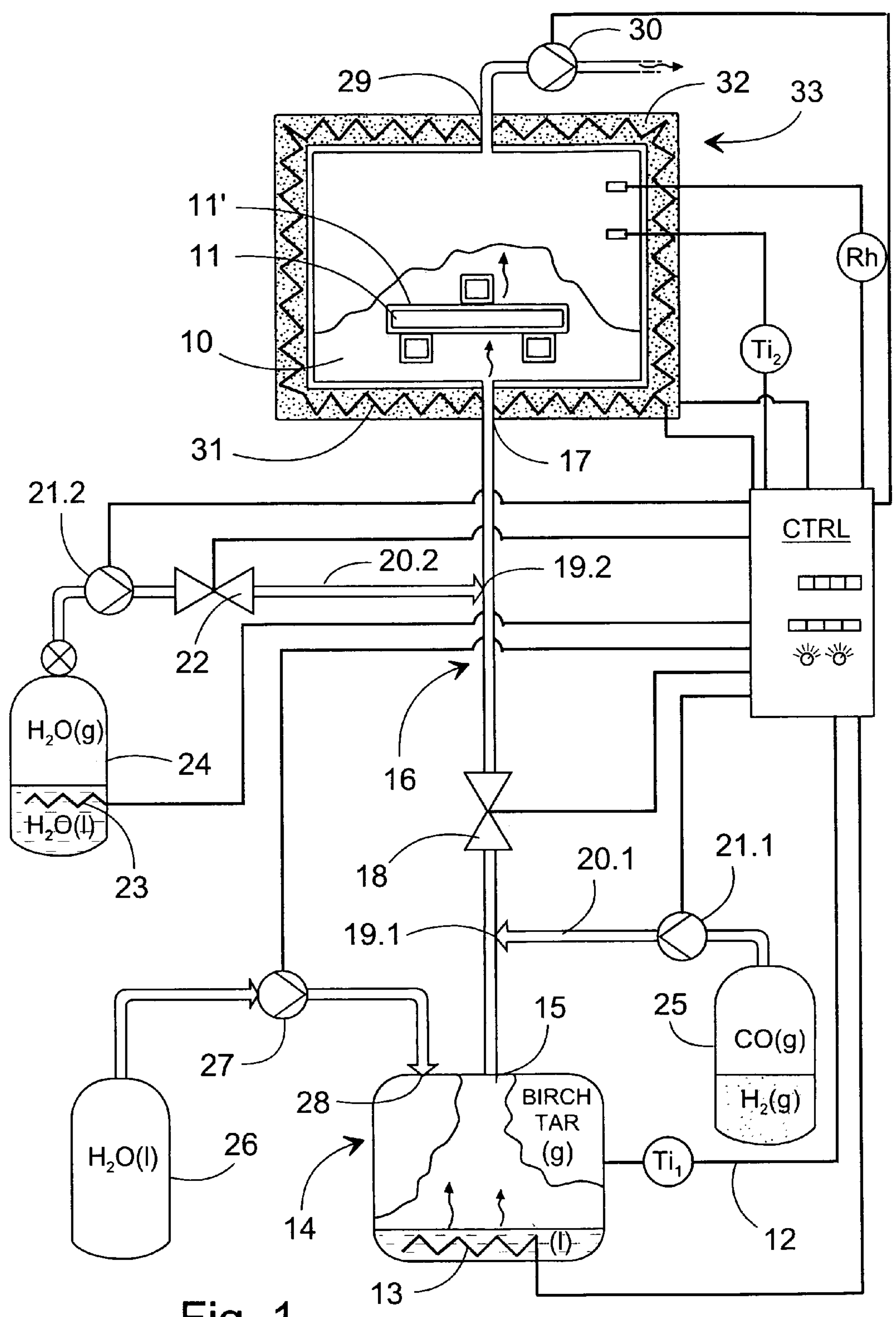
FIG. 1 shows a first embodiment of the method and equipment according to the invention and FIG. 2 shows a second embodiment of the method and equipment according to the invention.

FIG. 1 shows a first embodiment of the method and equipment according to the invention, for surfacing metal pieces. According to the invention, the method is particularly suitable for the anti-corrosive surfacing of carbon steels, through other surfacing applications are also possible. It should be noted that the following figures only attempt to illustrate the method and equipment according to the invention on a schematic level, so that the equipment constructions suitable for use in reality may be of a many different kinds.

In the method according to the invention, tar is used as the surfacing material and preferably originates from a dry distillation process (retort carbonization) of deciduous wood, such as birch or alder, carried out without air, or in substantially limited air content. The surfacing material is characterized by its high level of acidity, its pH value being, for example, in the order of 2. The surfacing treatment thus essentially corresponds to acid treatment, and partly for this reason can even be carried out directly on dirty and greasy surfaces 11', 28', without requiring special cleaning measures. Further, it also becomes possible, for example, to treat a metal surface coated with mill scale, without the separate pickling measures conventionally required for such a surface 11', 28'.

According to a first embodiment, the surfacing material can be brought to the surfacing application as separate compounds, all of which arise in the dry distillation process of deciduous wood. In this case, the surfacing application can be understood extremely widely. Examples include engineering workshops, shipyards, building sites, and industrial plants (such as car factories) manufacturing metal serial products.

Compounds can be divided according to their state into at least two fractions; that is, a liquid fraction and a gaseous fraction. A solids fraction is also possible for making the compounds arising in the dry distillation process into a surfacing material. The substances and compounds belonging to each fraction are defined on the basis of their gasification temperatures and they are partly then also affected by the ambient variables of the surfacing application, such as, for example, the temperature and pressure conditions. Thus, according to the first embodiment of the method, the surfacing material is formed by bringing these compounds into a mainly gaseous state and mixing them together in a known ratio, so that the end result obtained will be a corresponding gas mixture 10, which also essentially arises in a real dry distillation process of deciduous-wood.

The equipment includes heat devices, such as, for example, a gasification chamber 14 equipped with electrical resistances 13, in which, according to the first embodiment, a liquid fraction BIRCH-TAR (1) of the surfacing material is arranged. This liquid fraction of the liquid compounds in deciduous-wood tar is thus characterized by being in a liquid state at the temperature and pressure of the surfacing application. Examples of the compounds belonging to the fraction include various acids, such as acetic acid and fatty acids, as well as waxes and also free alcohols (for example, methanol) and phenol compounds. Further, water $H_2O$ (1), which can, however, be added as its own component to the gasification chamber 14 through a connection 28 from a reservoir 26 using a pump 27, can also be regarded as one of these compounds. Thus, in connection with the dry distillation process, the water is removed from the tar fraction BIRCH-TAR (1) supplied to the surfacing application in a liquid state, so that its volume can be significantly reduced. Water accounting for as much as a total of 30% of the entire product can form in the dry distillation process.

In the gasification chamber 14, a temperature sensor $Ti_1$, for which a signal line 12 is arranged to the control centre CTRL, is installed to control the gasification of the liquid fraction BIRCH-TAR (1). In the upper part of the gasification chamber 14, there is a connection 15, to which the first end of the surfacing-material feed line 16 is connected.

At the opposite end to the first end the feed piping 16 is connected to a connection 17 arranged for it in the gasification chamber 33. The feed piping 16 can have several branches and can include valves 18, 22 and connections 19.1, 19.2 for closing the various branch lines 20.1, 20.2, or for connecting them to the main line leading to the surfacing chamber 33. Further, the feed piping 16 can be isolated, or there can be heating devices connected to it, by means of which the gaseous surfacing material 10 is prevented from condensing while being transferred to the treatment chamber 33 (not shown).

In the aforesaid first embodiment imitating a dry distillation process of deciduous-wood, a reservoir 25, in which the gaseous fraction of the surfacing material 10 is stored, is connected to at least one of the branches 20.1 of the feed piping 16. This fraction is thus characterized by its constituents being uncondensed in the ambient conditions of the operation of the surfacing application, or at least essentially in its vicinity (NTP conditions), being in essentially a gaseous state and thus being difficult to liquidize without special liquidization devices. Examples of the said substances and compounds, of the surfacing material 10 according to the invention, belonging to the said gaseous fraction, are carbon monoxide (CO), hydrogen ($H_2$), volatile hydrocarbons (such as methane, terpenes), and carbon dioxide ($CO_2$), which arise in connection with the dry distillation of deciduous wood. In addition to these, the gas fraction can also include other substances. Each of the compounds can have its own reservoir and branch line for connecting them to the main line of the feed piping 16, or else they can also be ready mixed with each other in common reservoirs 25, in ratios according to the proportions arising in a real dry distillation process.

The equipment includes a scavenging-agent unit 24, connected to the main feed line, after the valve 18 after the gasification chamber 14, the branch line 20.2 of which includes a pump 21.2 connected to the control unit CTRL and a scavenging-agent valve 22. The scavenging agent can be, for example, water vapour $H_2O$(g). Other compounds can also be dissolved in water ($H_2O$), in order to neutralize the surface being treated. In the scavenging-agent unit 24, there are also heating devices 23, connected to the control centre CTRL, in order to form the water vapour $H_2O$(g).

Further, the equipment includes the said control centre CTRL, which is assembled from automation and logic components that are obvious to one versed in the art, and which can be programmed, in order to create a process of the desired type. The control centre CTRL is responsible for receiving and monitoring the measured process quantities, and for the process adjustments made on their basis. The control centre CTRL is also used to control the equipment's said valves 18, 22, pumps 21.1, 21.2, 27, 30 and other devices not referred to here, but which will be obvious to one versed in the art.

A through flow is arranged in the surfacing chamber 33. The through-flow effect creates conditions, in which the gaseous surfacing material 10 flowing through the chamber 33 scavenges the surface 11' of the piece of metal 11 being surfaced. In pilot-stage tests, it has been observed that the through flow is of essential importance for the success of the surface treatment according to the invention. For the through flow, the chamber 33 has one or more exhaust connections 29, through which the surfacing gas 10 is removed from the chamber 33. There may also be pumping 30 in the exhaust lines, boosting the through flow of the gas 10. The surfacing chamber 33 is otherwise preferably arranged to be as tight as possible, so that the amount of the through flow can be regulated through the exhaust connection 29. Condensation can be arranged for the gas 10 flowing through, from which its easily liquidizing fractions can be collected for storage and then for possible reuse. There can also be devices and stores for the collection of gaseous fractions that are difficult to liquidize (not shown).

The surfacing chamber 33 can also be insulated with insulation 32 and possible heating devices, such as, for example, electrical resistances 31, or pipes in which some heating liquid circulates, can be arranged in its walls. The heating is used to prevent possible condensation of the gaseous surfacing material 10 to the surfaces of the chamber 33. The intention is to keep the temperature of the walls of the surfacing chamber 33 above 220° C. and in the chamber 33 to above 200° C. The pressure conditions can correspond to the atmospheric pressure. Further, the chamber 33 can include condensate collection means, for possible condensate (not shown).

The process conditions of the surfacing chamber 33 are monitored by temperature and humidity sensors $Ti_2$, Rh, connected to the control unit CTRL.

The use of the surfacing material 10 according to the invention is based on the important observation made by the applicant that the gaseous phase of deciduous-wood tar has, together with possible solid particles, the property of reacting, in a suitable gaseous atmosphere, with the free electrons on the surface 11' of metals and binding extremely strongly to its base. One versed in the art will know this type of process as also gaseous-phase growth. In addition to the aforementioned deciduous-wood components, some inert noble gas can be mixed with the surface-treatment gas, in order to prevent oxidation and carbon loss. Some, but in no way restrictive, examples of such gases are argon Ar, xenon Xe, and helium He (not shown).

The formation of a carbide matrix on a composite base can be referred to as yet a further explanatory phenomenon of the surfacing method according to the invention. In pilot-stage research, this phenomenon has been shown to be significant, in, for instance, the formation of extreme hardness in an object being surfaced. It has not been possible to completely outline an exhaustive description of the phenomena of the actual surfacing event, at least at this pilot research stage, but the practicability of the method based on the natural product according to the invention has, however, been demonstrated experimentally.

Analyses carried out on the preliminary research results obtained in the pilot stage suggest that catalysis and/or certain types of polymerization processes relating to the metals on the surface may be involved. According to some analysis results, the surfacing may form as a type of two-layer structure, in which the lower would be, among other things, a matrix structure based on carbon and the top layer a (silicon) carbide-oxygen-carbon matrix. According to data obtained from the preliminary research results, the flow/temperature conditions appear to have an extensive effect on the progress of the process and on the formation of the layers. In addition, it has also been possible to make the surprising observation from the research results, that generally the PAH compounds, such as benzene, that typically arise in connection with pyrolysis processes, do not, however, combine to any significant extent with the surfacing or the surface being treated, so that the method according to the invention appears at least in this respect to be also environmentally and health-friendly.

The following describes the operation of the method and equipment according to the invention. Deciduous-wood tar BIRCH-TAR(1), which is fed to the gasification chamber 14 in a liquid state, in conditions specific to the operation environment of the surfacing application, is gasified by raiding the temperature of the chamber 14 to a preset value. In order that the compound used as the surfacing material 10 corresponds as genuinely as possible to the mixture of compounds arising in dry distillation of deciduous-wood, one or more substances or compounds in a solid state can be added to it. The solid constituents can be dissolved, for example, in a suitable amount of tar and added to the gasification chamber 14 prior to commencing the gasification. The function of the solid or powdered dry component is to provide the surfacing material 10 with the constituents, such as minerals, oxides, and carbides, for example, that also arise in a real dry distillation process.

The gas BIRCH-TAR(g) is led to the main feed piping, in which at least one of the compounds CO, $H_2$, $CO_2$, which arise in dry distillation of deciduous-wood, or in similar conditions, and which is already in a gaseous state in the operation conditions of the surfacing application, is added to it from one or more storage units 25 in a set ratio. The gas mixture can also be created by placing deciduous wood among the material being gasified (not shown).

The gas mixture 10 obtained, which corresponds essentially to the combination of substances arising in dry distillation of deciduous-wood, is led to the surfacing chamber 33, in which the piece 11 intended for surfacing is placed. The gas mixture condenses on the surface 11' to be surfaced and reacts according to the principles described above. Once the surfacing has continued for a specific time, the surface 11' begins to reject the condensate. At this stage, the surfacing material valve 18 is closed and intermediate scavenging is performed by leading a scavenging gas $H_2O$(g) to the main feed line from the scavenging unit 24.

The surfacing layer is grown by carrying out the drying intermediate scavenging using the scavenging gas $H_2O$(g) and repeating the surfacing gassing a sufficient number of times. If surfacing with the desired properties is achieved already with the first surfacing session, it will then be possible to avoid the temperature-raising stages that are performed separately and which would relate to each separate surfacing session. Once the surfacing conforms to the set criterion, the process is terminated with a final scavenging of sufficient duration. The set criterion can be defined, once the process conditions are know, for example, by calculation, or also by relying on experiential data. In the surfacing tests made in the pilot stage, 500 seconds was a suitable surfacing time for a 100-gramme test piece. 50 microns can be given as an example of the average thickness of the surfacing formed.

The surfacing time can also be adjusted in quite many ways. In test runs, it has been observed that using a slow increase in temperature, particularly in the temperature range of the actual surfacing process, will give a somewhat better surfacing result than using a rapid increase in temperature. Thus, by reducing the angle coefficient of the time-temperature curve, better results are achieved, at least up to a certain limit. In addition, the observation could also be made, that pickling occurs at the initial temperatures of the actual surfacing process and thereafter, or partly already at that time a polymerizing-type surface would be formed in a certain manner, as previously explained.

According to yet another preferred embodiment, when, for example, it is difficult for the surfacing material 10 to reach the surface 11' to be surfaced (for example, in the case of uneven and complicated structures), opposite potentials can be created electrically in the gasified surfacing material 10 and the surface 11' to be surfaced. This will assist the surfacing gas mixture 10 to reach inaccessible places.

Figure 2:
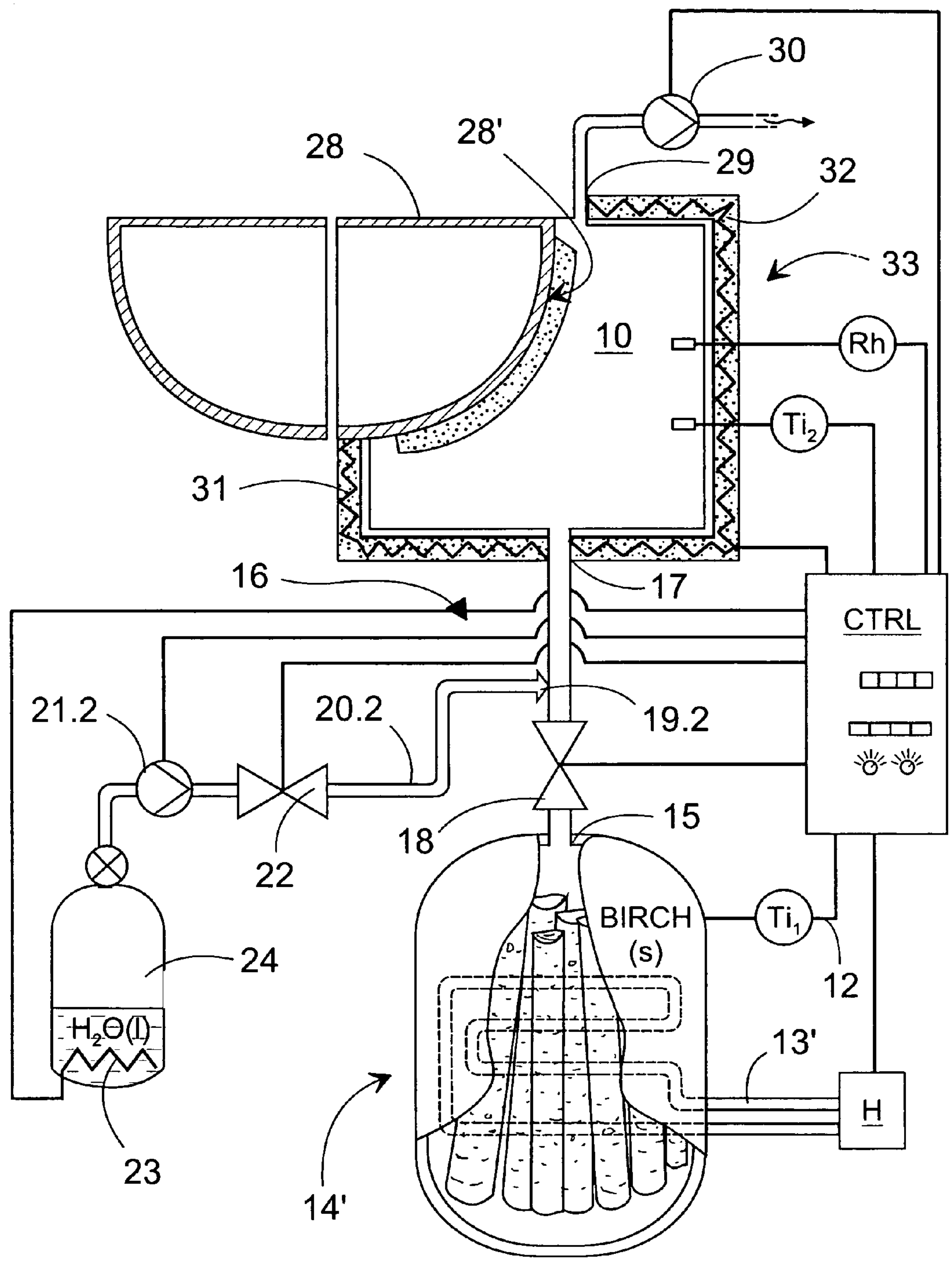

FIG. 2 shows a second embodiment of the method and equipment according to the invention. In this case, the surfacing material 10 is formed essentially in connection with the surfacing application. Deciduous wood, such as, for example birch BIRCH(s), is arranged in a carbonizing retort, which is heated under the control of the control centre CTRL, for example, using a fire-tube arrangement 13', H or in some other manner known to one versed in the art. In the exothermic stage of the carbonization (temperature above 220° C.), a powerful release of heat commences. The ignition of the pyroligneous acid, which has already started, continues, the ignition of the tar commences, and the release of gaseous hydrocarbons and hydrogen starts. It should be stated that the arrangement of the dry distillation process is, as such, a technique that will be obvious to one versed in the art, and no further explanation of it is regarded as necessary in this connection. The surfacing material 10, which arises in a gaseous state, is led to the surface treatment chamber, in which it reacts with the surface 28' being treated, according to the principles described above.

This example also shows an embodiment, in which the surfaced 28' being treated forms part of the wall of the surfacing chamber 33. The distance of the wall from the object being surfaced can be adjusted depending, for example, on the surface area of the nozzles discharging the surfacing material onto the object. An example of such a wall is the hull of a ship. Another example of a surfacing application, in which the wall of the surfacing chamber can also be the surface being surfaced, is the surfacing of pipes (not shown). The wall 28' being surfaced can also be charged electrically with a potential opposite to that of the surfacing material 10 while some type of heating, such as induction heating, can be applied to it.

Yet another important feature that can be mentioned is the fact that the surfacing chamber 33 can preferably be formed of, for example, some elastic material. It can then be shaped by bending to conform to the shape 28' for the surface being treated.

Further, the surfacing chamber 33 can be arranged to move of guides, so that it can be moved from the surfacing application that has already been complete, by a distance corresponding to its size, horizontally or vertically, and continue the treatment from a point adjacent to the treated surface. The effective, economical, and easy surface treatment of really large and difficult pieces (for example, bridges, buildings, towers, masts) will then become possible.

The walls of the surfacing chamber 33 can be easily assembled from prefabricated pieces, thus also permitting flexible changes in size to be made to it. Effective surfacing equipment for field conditions is created by placing the equipment in the necessary vehicle and the surfacing chamber 33, for example, in the loader of a machine (not shown).

Still referring to the example of equipment shown in FIG. 1, it is also possible to disclose such an embodiment, in which the surfacing chamber 33 and the gasification chamber 14 are arranged one inside the other. Thus, the gasification chamber 14 can be inside the surfacing chamber 33. The upper wall of the gasification chamber 14 can now be perforated and will correspond operationally to the feed piping 16 referred to in the aforementioned embodiments. The actual piece 11 being surfaced can then be on top of the perforated upper wall. The embodiment of the equipment shown in FIG. 1 appears, however, to be more practicable in production use.

The use of the method and surfacing material according to the invention will increase the profitability of the manufacture of charcoal. This will, in turn, promote the use of first thinnings of trees and, in turn, also first thinning. In addition to the birch and alder referred to above, other possible deciduous trees that can be used as raw material can include aspen, poplar, oak, and hickory, as chip waste, wood-chips, and similar wood waste etc. In the case of certain species of tree (for example, alder), it is surprisingly possible to even use rotten wood to obtain the desired kind of surfacing effect.

The end result is a surfacing that is attached very securely to its base, and which can be either a base or a final surfacing. The surfacing will resist conventional solvents and will not flake. The surface is in no way particularly slippery, but in a sliding contact it will slip without, however, being damaged. This is a particularly advantageous property, for example, in the case of the surfacing of tools.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

The invention claimed is:

1. A method for surface treating the surface of a metal, in which the surface treatment is performed in a surfacing chamber, using a surfacing material, which is formed of one or more compounds, and in which the surfacing material is brought to a principally gaseous state, the surfacing material is led to the chamber, and the surfacing material is permitted to react with the metal surface being treated, characterized in that the metal surface being treated is subjected in the chamber in which there is a through flow of the surfacing material to an exhaust connection, and in which the said surfacing material comprises compounds arising in dry distillation of deciduous-wood.

2. A method according to claim 1, characterized in that the surfacing material is formed of at least two fractions wherein the first fraction includes compounds condensed in the said dry distillation process and the second fraction includes uncondensed compounds.

3. A method according to claim 2, characterized in that when the surfacing material is formed, part of the compounds included in the surfacing material are brought to the process in a solid state.

4. A method according to claim 1, characterized in that part of the surface being treated comprises at least part of the internal surface of the said chamber.

5. A method according to claim 1, characterized in that the surface-treatment process includes in addition one or more intermediate scavenging stages, in order to at least dry the surface layer.

6. A method according to claim 1, characterized in that at least part of the surface being treated and of the surfacing material are charged electrically to different potentials, in order to bring the surfacing material to the surface being surfaced.

7. A method according to claim 1, characterized in that at least part of the wall of the surfacing chamber is charged electrically to a different potential relative to the surfacing material, the surface being surfaced being part of the wall of the chamber.

* * * * *